(12) United States Patent
Haba (10) Patent No.: US 7,638,868 B2
(45) Date of Patent: Dec. 29, 2009

(54) MICROELECTRONIC PACKAGE

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 316 days.

(21) Appl. No.: 11/504,857

(22) Filed: Aug. 16, 2006

(65) Prior Publication Data

US 2008/0042249 A1 Feb. 21, 2008

(51) Int. Cl.
*H01L 23/02* (2006.01)
(52) U.S. Cl. ............................. 257/686; 257/E23.169
(58) Field of Classification Search ................ 257/685, 257/686, 692, 698, E23.141, E23.168, E23.169
See application file for complete search history.

(56) References Cited

U.S. PATENT DOCUMENTS

| | | | |
|---|---|---|---|
| 4,878,611 | A | 11/1989 | LoVasco et al. |
| 5,222,014 | A | 6/1993 | Lin |
| 5,247,423 | A | 9/1993 | Lin et al. |
| 5,998,864 | A | 12/1999 | Khandros et al. |
| 6,445,594 | B1 | 9/2002 | Nakagawa et al. |
| 6,765,287 | B1 | 7/2004 | Lin et al. |
| 2002/0043709 | A1 | 4/2002 | Yeh et al. |
| 2002/0053727 | A1 | 5/2002 | Kimura |
| 2002/0074630 | A1 | 6/2002 | Ando et al. |
| 2002/0121687 | A1 | 9/2002 | Winderl |
| 2002/0190396 | A1 | 12/2002 | Brand |
| 2003/0102546 | A1 | 6/2003 | Lee et al. |
| 2003/0183930 | A1 | 10/2003 | Fukasawa |
| 2004/0026773 | A1* | 2/2004 | Koon et al. .................. 257/692 |
| 2004/0090759 | A1 | 5/2004 | Kim |
| 2005/0104196 | A1 | 5/2005 | Kashiwazaki |
| 2005/0284658 | A1 | 12/2005 | Kubota et al. |
| 2005/0285246 | A1 | 12/2005 | Haba et al. |
| 2006/0202317 | A1* | 9/2006 | Barakat et al. .............. 257/686 |
| 2006/0290005 | A1 | 12/2006 | Thomas et al. |

FOREIGN PATENT DOCUMENTS

| | | |
|---|---|---|
| DE | 10023823 | 12/2001 |
| EP | 0 615 283 | 9/1994 |
| WO | 2007075678 | 7/2007 |

OTHER PUBLICATIONS

International Search Report, PCT/US2007/018521.

* cited by examiner

*Primary Examiner*—Zandra Smith
*Assistant Examiner*—Paul E Patton
(74) *Attorney, Agent, or Firm*—Lerner, David, Littenberg, Krumholz & Mentlik, LLP

(57) ABSTRACT

A microelectronic package includes a lower unit having a lower unit substrate with conductive features and a top and bottom surface. The lower unit includes one or more lower unit chips overlying the top surface of the lower unit substrate that are electrically connected to the conductive features of the lower unit substrate. The microelectronic package also includes an upper unit including an upper unit substrate having conductive features, top and bottom surfaces and a hole extending between such top and bottom surfaces. The upper unit further includes one or more upper unit chips overlying the top surface of the upper unit substrate and electrically connected to the conductive features of the upper unit substrate by connections extending within the hole.

19 Claims, 5 Drawing Sheets

MICROELECTRONIC PACKAGE

BACKGROUND OF THE INVENTION

The present invention relates to microelectronic apparatuses and methods for making microelectronic components for microelectronic packages and assemblies.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Certain types of packages have been developed, which utilize a microelectronic component having a dielectric substrate having conductive traces disposed thereon. In such an arrangement, electrically conductive posts or pillars project from a surface of the substrate. Each post is connected to a portion of one of the traces. This type of microelectronic component is particularly useful in chip packages having arrangements that allow each post to move independently of the other posts. The movement of the posts allows the tips of the plural post to simultaneously engage contact pads on a circuit board despite irregularities in the circuit board or the package, such as warpage of the circuit board. Additionally, this facilitates testing of the package using simple test boards that may have substantially planar contacts, and avoids the need for specialized, expensive test sockets.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a substrate spaced from and overlying a first face of the microelectronic element. Such a component can include a plurality of conductive posts extending from the substrate and projecting away from the microelectronic element, at least some of the conductive posts being electrically interconnected with the microelectronic element. Additionally, such a package can include a plurality of support elements disposed between the microelectronic element and the substrate and supporting the substrate over the microelectronic element. Desirably, at least some of the conductive posts are offset in horizontal directions parallel to the plane of the substrate from the support elements. For example, the support elements may be disposed in an array with zones of the substrate disposed between adjacent support elements, and the posts may be disposed near the centers of such zones.

The dielectric substrate utilized in such a microelectronic component can be made from a material such as a polyimide or other polymeric sheet. It includes a top surface and a bottom surface remote therefrom. Although the thickness of the dielectric substrate will vary with the application, the dielectric substrate most typically is about 10 m-100 m thick. The sheet has conductive traces thereon. In one embodiment the conductive traces are disposed on the bottom surface of the sheet. However, in other embodiments, the conductive traces may extend on the top surface of the sheet; on both the top and bottom faces or within the interior of substrate. Conductive traces may be formed from any electrically conductive material, but most typically are formed from copper, copper alloys, gold or combinations of these materials. The thickness of the traces will also vary with the application, but typically is about 5 m-25 m. Traces are arranged so that each trace has a support end and a post end remote from the support end. The dielectric sheet, traces and posts can be fabricated by a process such as that disclosed in co-pending, commonly assigned U.S. patent application Ser. No. 10/959,465, the disclosure of which is incorporated by reference herein. As disclosed in greater detail in the '465 application, a metallic plate is etched or otherwise treated to form numerous metallic posts projecting from the plate. A dielectric layer is applied to this plate so that the posts project through the dielectric layer. An inner side of the dielectric layer faces toward the metallic plate, whereas the outer side of the dielectric layer faces towards the tips of the posts. Previously this dielectric layer has been fabricated by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the sheet in any suitable manner, which connects the posts to the traces.

Despite these advances in the art, still further improvements in making microelectronic components would be desirable.

SUMMARY OF THE INVENTION

The present invention is directed to a microelectronic package that may include a lower unit having a lower unit substrate with conductive features and a top and bottom surface. The lower unit includes one or more lower unit chips overlying the top surface of the lower unit substrate that are electrically connected to the conductive features of the lower unit substrate. The microelectronic package also includes an upper unit including an upper unit substrate having conductive features, top and bottom surfaces and a hole extending between such top and bottom surfaces. The upper unit further includes one or more upper unit chips overlying the top surface of the upper unit substrate and electrically connected to the conductive features of the upper unit substrate by connections extending within the hole. The upper unit substrate being disposed over the lower unit chips and the hole and the connections of the upper unit being offset in a first horizontal direction from the lower unit chips.

The microelectronic package may also include electrically conductive connections electrically connecting the conductive features of the upper unit substrate and the lower unit substrate. The conductive connections may define a pattern, and the hole of the upper unit being offset in the first horizontal direction relative to the pattern. The one or more lower unit chips may be offset relative to the pattern in a second horizontal direction opposite to the first horizontal direction.

The lower unit may have a hole extending between the top and bottom surfaces of the lower unit substrate such that the one or more lower unit chips are electrically connected to conductive features of the lower unit substrate by connections extending through the hole in the lower unit substrate. The lower unit substrate may also be offset relative to the pattern of the conductive connections in the second horizontal direction.

In an alternate embodiment, the package may include a first microelectronic element having a plurality of contacts and a second microelectronic element having a plurality of contacts. The first microelectronic element being positioned over the second microelectronic element. And a dielectric element having a first face, a second face and a hole extending from the first face to the second face. The dielectric element further including conductive features exposed at the second face, and the second microelectronic element being positioned above said dielectric element.

The package also may include a first set of connection elements extending between the plurality of contacts of the first microelectronic element and at least some of the conductive features of the dielectric element. A second set of connection elements extending between the plurality of contacts of the second microelectronic element and at least some of the conductive features of the dielectric element. At least some of the first set of connection elements and at least some of the second set of connection elements extend through the hole of the dielectric element.

The present invention also includes a method of manufacturing a microelectronic package. In one embodiment, the method includes attaching a first chip to a second chip such that a first portion of the first chip extends outwardly beyond a first portion of the second chip. And attaching the second chip to a first face of a substrate. The substrate having an oppositely-facing second face that includes conductive elements and at least one hole extending therethrough. The method may also include electrically connecting the first chip and the second chip to the conductive elements of the substrate via connection elements. At least one connection element electrically connecting the first chip to the conductive elements and at least one connection element electrically connecting the second chip to the conductive elements extending through a common hole of the substrate.

In another aspect of the present invention, the method of manufacturing a microelectronic package includes preparing a first unit including a first substrate with conductive features and a top and bottom surface. The first unit including one or more first unit chips overlying the top surface of the first unit substrate. The method also includes electrically connecting the first unit chips to the conductive features of the first unit substrate. A second unit including a second unit substrate having conductive features, top and bottom surfaces and a hole extending between such top and bottom surfaces is prepared. The second unit further including one or more second unit chips overlying said top surface of said second unit substrate. The second unit chips are electrically connected to the conductive features of the second unit substrate with connection elements. The second unit is positioned over the first unit chips such that the hole and the connections of the second unit are offset in a first horizontal direction from the first unit chips.

DETAILED DESCRIPTION

Figure 1:
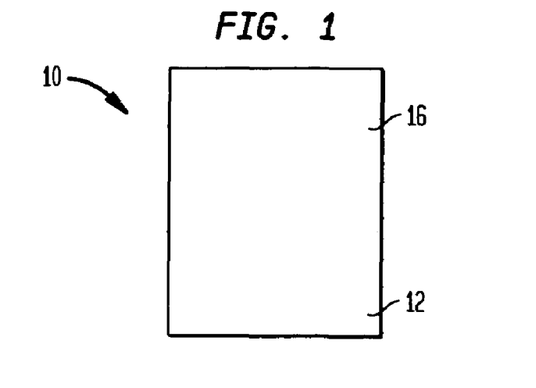
FIG. 1 is a top view of a first component used in conjunction with the present invention.
Figure 2:
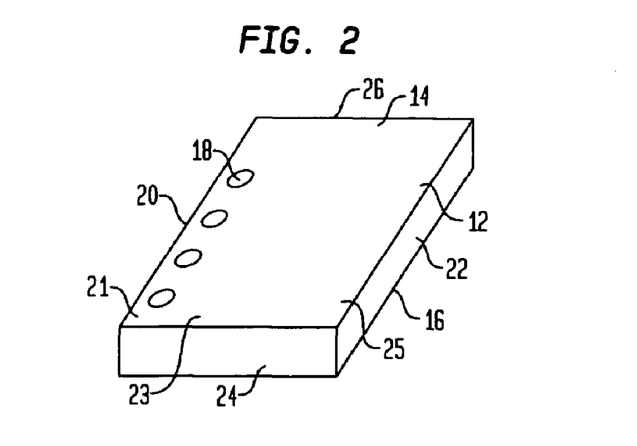
FIG. 2 is a bottom perspective view of the component of FIG. 1.

A microelectronic package 10, in accordance with one embodiment of the present invention, includes a microelectronic element, such as semiconductor chip 12 shown in FIGS. 1 and 2. The chip 12 includes a first or contact bearing surface 14 and an oppositely-facing second surface 16. The chip 12 also includes a plurality of edges extending between the first surface 14 and the second surface 16, including first edge 20 and oppositely-facing second edge 22, as well as third edge 24 and oppositely-facing fourth edge 26. Additionally, the first surface 14 of the chip 12 includes a contact portion 21 adjacent first edge 20, a remote portion 25 adjacent second edge 22, and a central portion 23 positioned between the contact portion and the remote portion. A plurality of contacts 18 are exposed at the contact portion 21 to enable the chip 12 to be electrically connected to other devices as will be described below.

In one aspect of the present invention, as shown in FIG. 2, the contacts 18 are disposed proximate the first edge 20 and remote from second edge 22. The contacts 18 are also disposed in the contact portion 21 of the chip 12. Although not shown in the figure, a passivation layer may be formed over the first surface 14 of the chip 12 with openings positioned adjacent contacts 18, such that the contacts are exposed.

Figure 3:
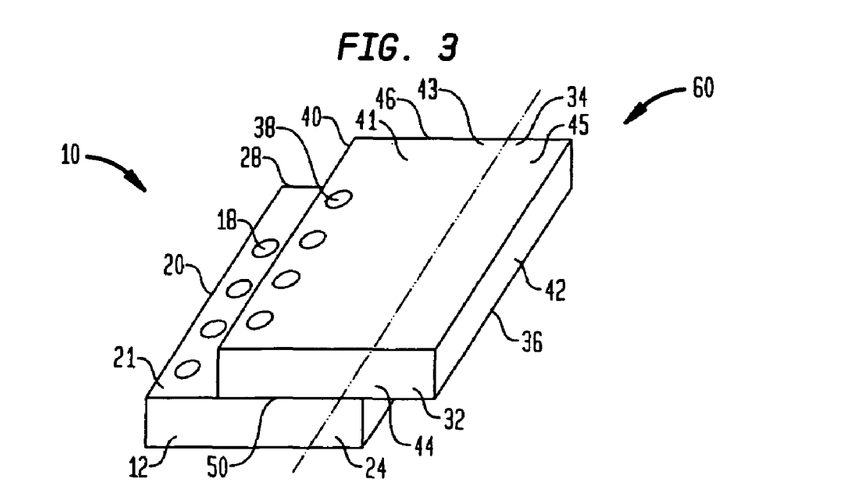
FIG. 3 is a bottom perspective view of the component of FIGS. 1 and 2 at a later stage of assembly.

Referring to FIG. 3, the microelectronic package 10 includes a second microelectronic element, such as a semiconductor chip 32, which is similar to chip 12. Chip 32 preferably includes a first surface 34 bearing electrical contacts such as contacts 38 exposed there at. Chip 32 also includes an oppositely-facing second surface 36. And similar to chip 12, chip 32 includes a first edge 40, a second edge 42, a third edge 44, and a fourth edge 46, each extending between and connecting the first surface 34 to the second surface 36 of chip 32. The first surface 34 of chip 32 also includes a contact portion 41 adjacent first edge 40, a remote portion 45 adjacent second edge 42 and a central portion 43 positioned between the contact portion and the remote portion. The contacts 38 are positioned adjacent first edge 40 in the contact portion 41 of the chip 32.

In a method of assembly, the two chips, 12 and 32 are brought proximate to one another and stacked one upon the other such that the second surface 36 of chip 32 confronts the first surface 14 of chip 12. Chip 12 may be attached to the chip 32 using an encapsulant material 50 such as an epoxy, to thereby hold the chips relative to one another.

The chip 32 is positioned onto chip 12 such the respective contact portions 21, 41 of the chips are not encumbered. For instance, as shown in FIG. 3, the first edge 40 of chip 32 is positioned within the central portion 23 of chip 12. Preferably, first edge 40 of chip 32 is parallel with first edge 20 of chip 12 when the chips are placed in position. In this configuration, the contact portion 41 of chip 32 overlies the central portion 23 of chip 12. And the central portion 43 of chip 32 overlies the remote portion 25 of chip 12. The remote portion 45 of chip 32 extends outwardly beyond second edge 22 of chip 12. By placing the first edge 40 of chip 32 in line with the central portion 23 of chip 12, an "off-set stack" or "staircase" configuration is achieved. This off-set stack configuration enables both the contacts 18 of chip 12 and contacts 38 of chip 32 to be exposed at their respective surfaces without being encumbered by additional objects. This allows the contacts 18, 38 to be electrically connected to additional devices, as will be described below. The combination of chip 12 and chip 32 connected together forms a subassembly 60.

Figure 4:
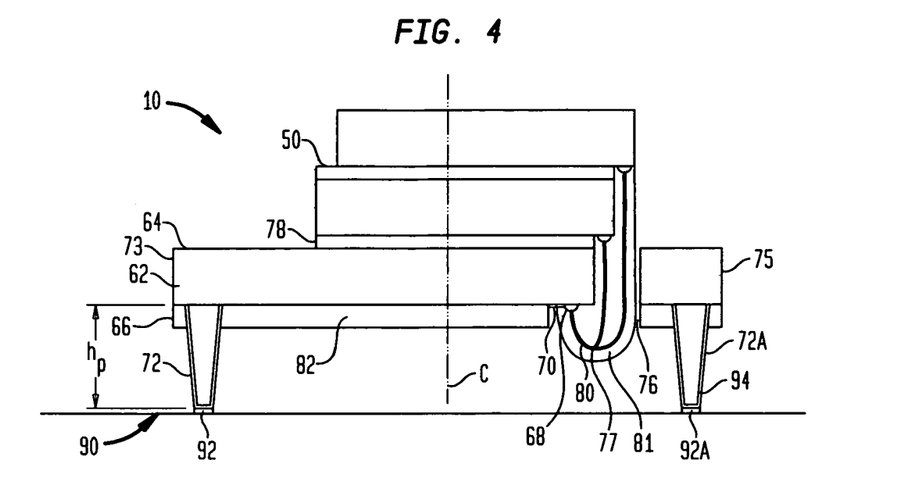
FIG. 4 is a cross-sectional view of a stacked package according to one embodiment of the present invention.

Referring to FIG. 4, the microelectronic package 10 includes a substrate such as dielectric element 62 that has a first surface 64 and an oppositely-facing second surface 66. The dielectric element 62 may be rigid or flexible. The dielectric element 62 may be comprised of a polyimide or other polymeric sheet. Although the thickness of the dielectric element may vary, the dielectric element most typically is about 10 μ-100 μ thick. The dielectric element 62 preferably includes a plurality of conductive elements such as bond pads 68, traces 70, and conductive posts 72. The bond pads 68, traces 70, and conductive posts 72 may be created using the methods illustrated in commonly assigned U.S. Published application Ser. No. 11/014,439, the disclosure of which is hereby incorporated by reference herein. In the particular embodiment illustrated, the conductive elements are disposed on the second surface 66 of dielectric element 62. However, in other embodiments, the conductive elements may extend on the first surface 64 of dielectric element 62; on both the first and second surfaces or within the interior of the dielectric element. Thus, as used in this disclosure, a statement that a first feature is disposed "on" a second feature should not be understood as requiring that the first feature lie on a surface of the second feature.

At least some of the bond pads 68 are electrically connected to at least some of the traces 70, which in turn are electrically connected to at least some of the conductive posts 72. This creates a plurality of continuous lines of electrically connected elements, thereby electrically connecting each of the elements within each continuous line. Bond pads 68, traces 70 and conductive posts 72 may be formed from any electrically conductive material, but most typically are formed from copper, copper alloys, gold or combinations of these materials. The thickness of the bond pads 68 and traces 70 will vary but typically are about 5 μ-25 μ. The conductive posts 72 extend downwardly from the dielectric element 72. The dimensions of the conductive posts 72 can vary over a significant range, but most typically the height $h_p$ of each conductive post below the second surface 66 of the dielectric element 62 sheet is about 50-300 μ.

Figure 5A:
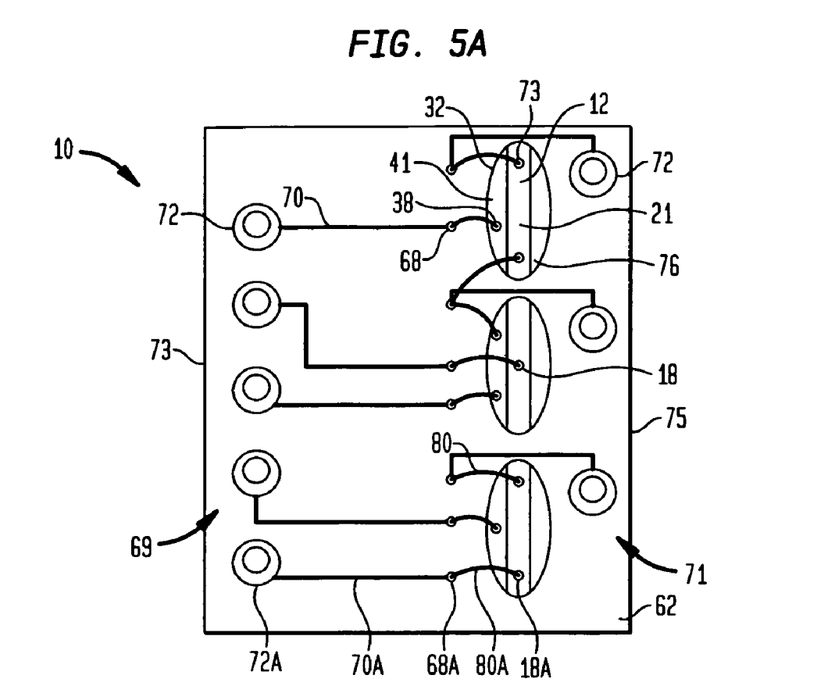
FIG. 5A is a bottom view of the embodiment illustrated in FIG. 4.

Dielectric element 62 preferably includes a plurality of holes 76, as shown in FIGS. 4 and 5A, extending from the first surface 64 of the dielectric element to the second surface 66. In one aspect of the present invention, the subassembly 60 is attached to the dielectric element 62 such that the contact portions 21, 41 of the respective chips 12, 32 are aligned with the holes 76 of the dielectric element, as shown in FIG. 4. The subassembly 60 and specifically the first surface 34 of chip 32 may be attached to the first surface 64 of dielectric element 62 using an epoxy such as encapsulant material 78. In this configuration, the contacts 18, 38 of chips 12, 32 are aligned with holes 76.

To electrically connect the subassembly 60 to the bond pads 68, a connection element such as wire leads 80 may be utilized. A first end of each wire lead 80 is attached to a single contact pad 18, 38. Each wire lead extends downwardly from a respective bond pad 18, 38 and through one of the holes 76. The opposite end of each wire lead 80 is attached to a single bond pad 68. Thus, the wire leads 80 place individual contact pads 18, 38 into electrical communication with individual bond pads 68. And since the bond pads 68 are electrically connected to the conductive posts 72, via the traces 70, the contact pads 18, 38 are also in electrical connection with the conductive posts 72. When connecting the wire leads to bond pads 68, the wire leads 80 have portions extending below the bond pads 68 and below the dielectric element 62 but not as low as the lowest ends of the conductive posts 72. The portions of the wire leads 80 below the dielectric element 62 are exaggerated in the figures so as to highlight this feature. Once the wire leads 80 have been correctly assembled, an encapsulant material 81 is disposed over the wire leads 80 to provide rigidity to the wire leads as well as to protect them from damage. The encapsulant material 81 preferably extends within the holes 76 and also maintains separation between adjacent wire leads 80. The encapsulant material 81 also projects below the dielectric element but not as low as the lowest ends of the conductive posts 72.

The microelectronic package 10 may also include a solder mask layer 82 disposed over various electrical conductive features as known to those in the art.

With reference to FIG. 5A, the holes 76 in the microelectronic package 10 comprise a plurality of openings, each aligned with contact portions 21, 41 of chips 12, 32, respectively. The holes 76 are large enough so that more than one wire lead 80 may extend from a respective contact 18, 38 to a respective bond pad 68. Each bond pad 68 is attached to a trace 70, which is itself attached to a conductive post 72 thereby electrically connecting a respective contact 18, 38 of a chip 12, 32 to a conductive post.

A first set 69 of conductive posts 72 is arranged adjacent edge 73 of dielectric element 62. And a second set 71 of conductive posts 72 are arranged adjacent edge 75 of dielectric element 62. By placing conductive posts 72 on both sides of holes 76, the microelectronic package 10 is balanced and can easily be mounted to an additional substrate such as a circuit panel or the like.

Microelectronic package 10 also includes a ground conductive post 72A. Ground conductive post 72A is electrically connected to a ground contact, as for instance ground contact 18A of chip 12 and ground contact 38A of chip 38. The elements are connected using ground wire leads 80A, which are both attached to a ground bond pad 68A and subsequently a ground trace 70A. The ground wire leads 80A, ground bond pad 68A, and ground trace 70A are similar to their respective non-ground counterpart elements but the ground elements enable the chips to be grounded to a ground contact pad on a circuit panel. Although not shown, a ground plate may also be provided to aid in the grounding of chips 12, 32. The ground plate may be positioned between chips 12, 32 or on top/below the chips 12, 32. In addition a single ground plate may be utilized by both chips 12, 32 or a single ground plate may be supplied for each chip.

As shown in FIG. 4, microelectronic package 10 may have a center line C which passes through a center axis of the package. The center line C is positioned between ends 73, 75 of dielectric element 62. As shown in FIG. 4, chip 12 is offset from center line C in that the chip extends more toward end 75 than toward end 73. Holes 76 is positioned between center line C and end 75.

After the microelectronic package 10 is constructed, the microelectronic package 10 may be attached to a circuit panel 90, as shown in FIG. 4. In order to attach the microelectronic package 10 to the circuit panel 90, the conductive post 72 and ground conductive post 72A of microelectronic package 10 are brought proximate to contact pads 92 exposed at a surface of the circuit panel 90. The ground conductive posts 72A is brought proximate a ground contact pad 92A. Once in proximity, an electrically conductive material such as a solder 94 may be placed between the contact pads 92, 92A and conductive posts 72, 72A so as to create an electrical connection. Even though the curved portions 77 of the wire leads 80 extend downwardly below the dielectric element 62 and even below the solder mask layer 82, the curved portions remain remote from the circuit panel 90 because of the height created between the solder mask layer 82 and circuit panel by the conductive posts 72, 72A.

Figure 5B:
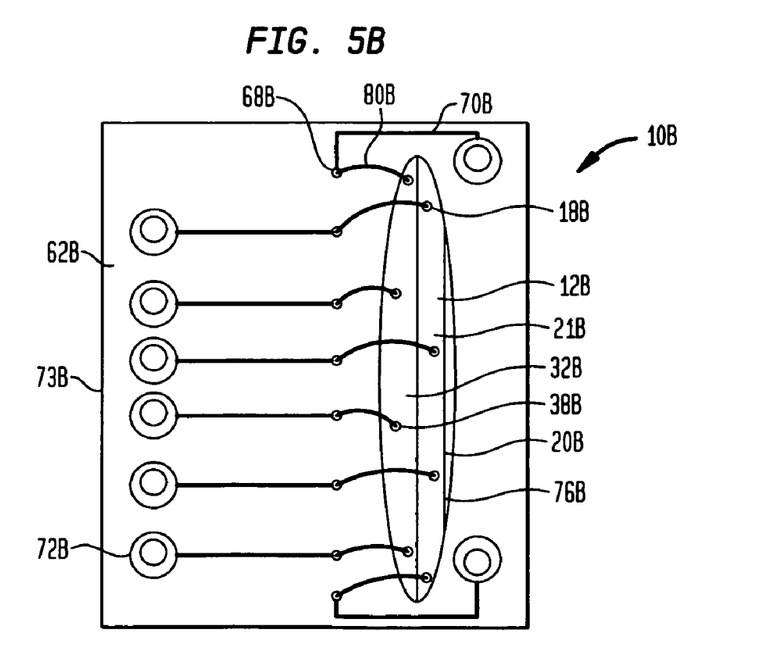
FIGS. 5B-5C are bottom views of additional embodiments of the present invention.

In alternate embodiments of the present invention the microelectronic package may have a different configuration. For instance, as illustrated in FIG. 5B, microelectronic package 10B is similarly constructed to microelectronic package 10 except that dielectric element 62B of microelectronic package 10B only includes a single hole 76B. The single hole 76B underlies most of the contact portions 21B, 41B of chips 12B, 32B. And all of the contacts 18B, 38B of chips 12B, 32B are exposed through hole 76B. Hole 76B extends in a longitudinal direction that is parallel to first edge 20B of chip 12B.

The single hole 76B is equivalent to the plurality of holes 76 in microelectronic package 10. Similar to microelectronic package 10, the contacts 18B, 38B of microelectronic package 10B are electrically connected to bond pads 68B by wire leads 80B. And subsequently, bond pads 68B are electrically connected to traces 70B and conductive posts 72B. By providing a single hole all of the wire leads 80B connecting contacts 18B, 38B to bond pads 68B pass through the same opening.

In addition, microelectronic package 10B differs from microelectronic package 10 in that most of the conductive post 72B are positioned remote from hole 76B and adjacent edge 73B of dielectric element 62B. Although the conductive posts 72B adjacent edge 73B are illustrated aligned with one another, they may be staggered so as to allow more conductive posts to be placed within an area.

Figure 5C:
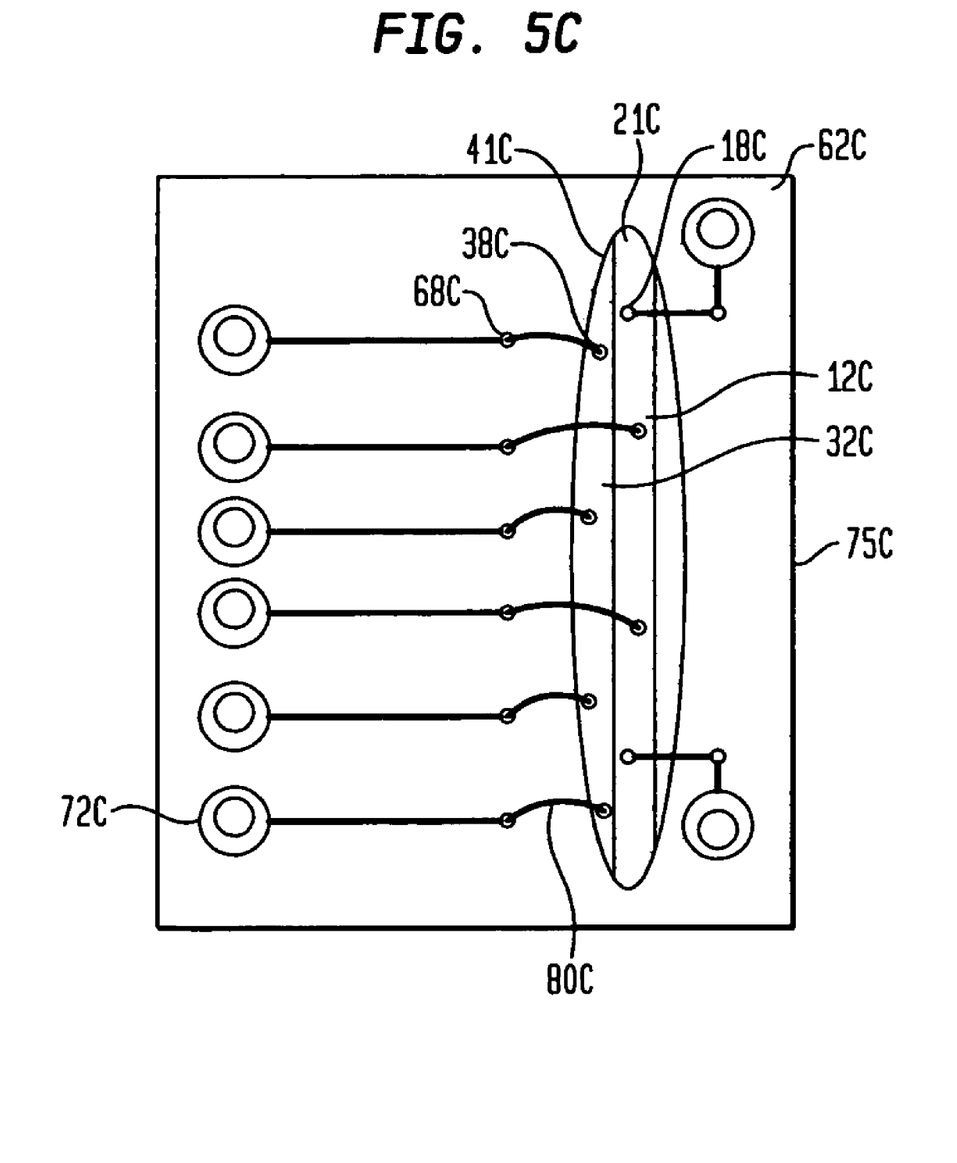

In another aspect of the present invention, as shown in FIG. 5C, the bond pads 68C may be on both sides of hole 76C as opposed to only one side. Microelectronic package 10C, shown in FIG. 5C is similar to previous embodiments discussed herein except for the different arrangement of the conductive features disposed on the dielectric element 62C. For instance, unlike previous embodiments, the bond pads 68C of microelectronic package 10C are disposed on both sides of hole 76C thereby allowing the wire leads 80C, which connect the bond pads 68C to contacts 18C, 38C of chips 12C, 32C respectively, to extend about both sides of the hole 76C. Once again, hole 76C is preferably aligned with contact portions 21C, 41C of chips 12C, 32C such that the contacts 18C, 38C are accessible. Although only two bond pads 68C are shown adjacent edge 75C of dielectric element 62C, various alternate embodiments may be constructed, which are more symmetrical.

Figure 6:
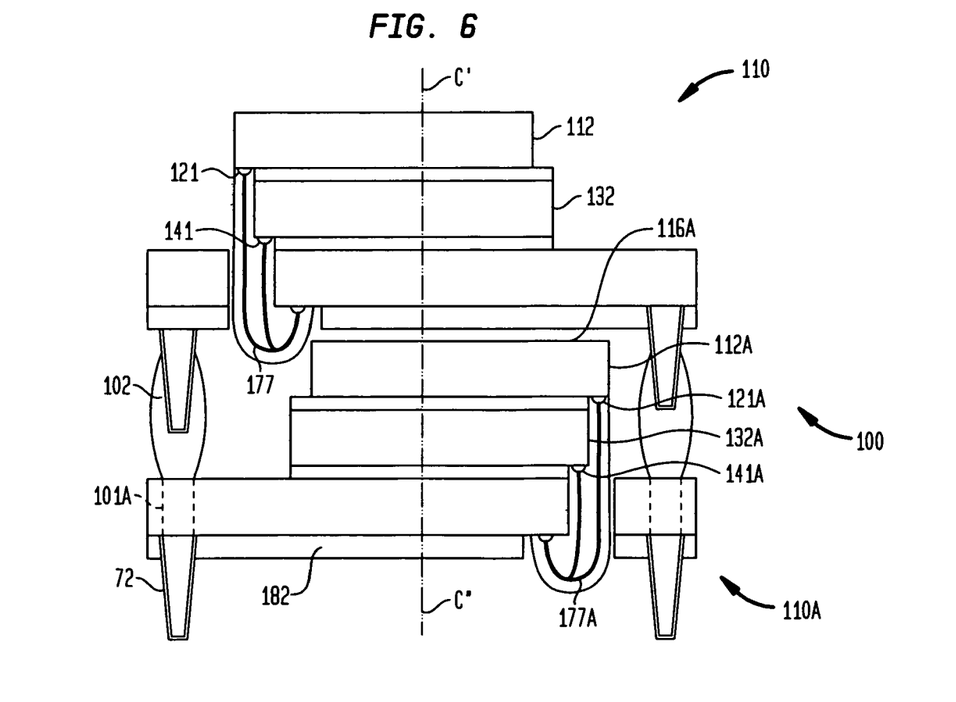
FIG. 6 is a cross-sectional view of an embodiment of the present invention.

In one aspect of the present invention, two microelectronic packages may be stacked one on top of another. For instance, a staggered stack pack 100 is shown in FIG. 6 having two microelectronic packages 110, 110A. Microelectronic packages 110, 110A are similar to microelectronic package 10 discussed herein, but additional embodiments may be used without deviating from the scope of the invention. Each of the microelectronic packages 110, 110A include a first chip 112, 112A and a second chip 132, 132A attached to the respective first chip. Each microelectronic packages 110, 110A further includes a dielectric element 162, 162A, attached to the respective second chips 132, 132A.

One difference between microelectronic packages 110 and 110A is that microelectronic package 110 is a left staggered stack package and microelectronic package 110A is a right staggered stack package. In a left staggered stack package the contact portion 121 of the top chip 112 extends outwardly beyond the left edge of the bottom chip 132. And the contact portion 141 of the bottom chip 132 is on the left of the chip. In contrast, in a right staggered stack package the contact portion 121A of the top chip 112A extends outwardly beyond the right edge of the bottom chip 132A. And the contact portion 141A of the bottom chip 132A is on the right of the chip. In addition, in a right staggered stack package 110A, holes 176A are positioned between a center line C' and end 175A of substrate 162A. Also, chip 112A is offset from the center line C' towards end 175A. But in a left staggered stack package 110, chip 112 is offset from a centerline C" toward end 173 of substrate 162 and holes 176 are positioned between centerline C" and end 173. Of course, the order of stacking may be altered.

With reference to FIG. 3, it can be observed that a right staggered stack package and a left staggered stack package may be the exact same structure. For instance, if microelectronic packages 110, 110A were both microelectronic packages 10, in a left staggered stack package edge 23 of chip 12 faces out of the page. But in a right staggered stack package edge 24 of chip 12 faces out of the page. Thus, the staggered stack pack 100 may be constructed using two identical microelectronic packages.

To create the staggered stack pack 100, microelectronic package 110 is brought proximate to microelectronic package 110A. The lower ends of conductive posts 172 of microelectronic package 110 are aligned with the top surfaces of the conductive posts 172A of microelectronic package 110A. Preferably, dielectric element 162A includes a plurality of vias 101 that expose at least part of the top surfaces of conductive posts 172A.

With reference still to FIG. 6, microelectronic package 110 may be brought proximate to microelectronic package 110A until the curved portions 177 of microelectronic package 110, which extend downwardly beyond the solder mask layer 182 of microelectronic package 110 also extend downwardly past the second surface 166A of chip 112A. Once the right and left staggered stack packages 110, 100A are in position, conductive material 102 such as solder may be disposed in and around the conductive posts 172 and into vias 101 thereby connecting the top surface of conductive posts 172A to conductive posts 172. The conductive material 102 not only electrically connects conductive posts 172 to conductive posts 172A but also provides the framework to hold the microelectronic packages 110, 110A together such that the staggered stack pack 100 is formed.

By placing a left staggered stack package 110 above (or below) a right staggered stack package 110A, the overall height of the staggered stack pack 100 may be reduced. This is because the curved portions 177 of wire leads 180 are not required to be disposed higher than the second surface 116A of chip 112A and the overall height of the "sandwich" is lessened.

Figure 7:
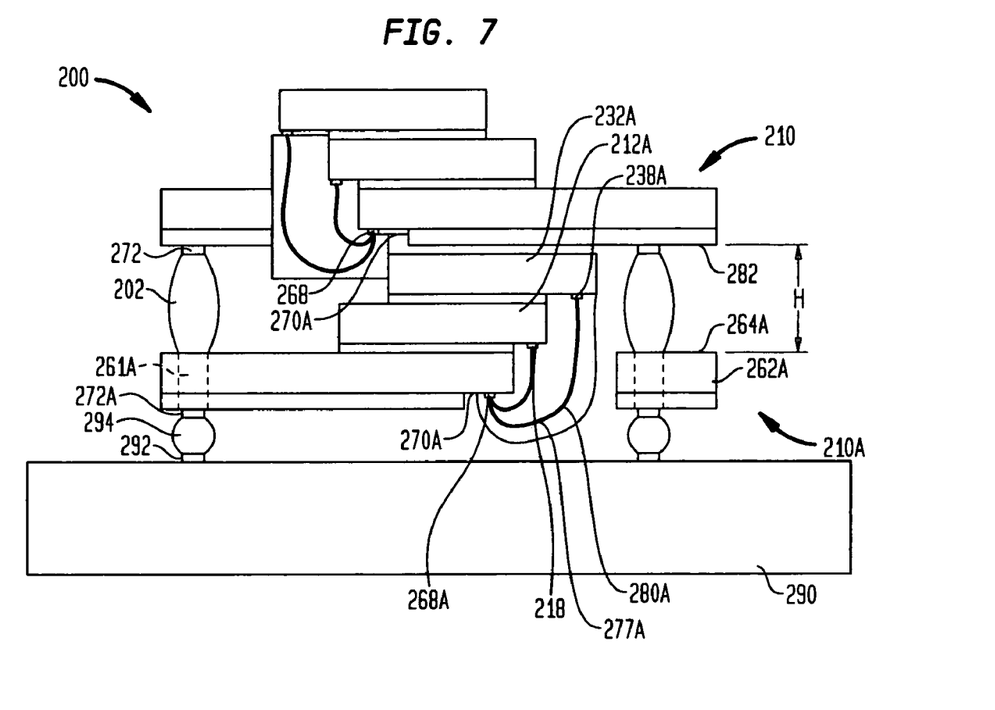
FIG. 7 is a cross-sectional view of an alternate embodiment of the present invention.

In an alternate embodiment, with reference to FIG. 7, either one or both of the left staggered stacked package and right staggered stack package may include pads as opposed to conductive posts. For instance, as shown in FIG. 7, right staggered stack package 210A and left staggered stack package 210 are similarly constructed as packages 110, 110A. However, in left staggered stack package 210 and right staggered stack package 210A, the conductive posts in the previous embodiment have been replaced with contact pads 272 and 272A. Contact pads 272, 272A perform similar functions as the conductive posts previously described herein and are preferably electrically connected to bond pads 268, 268A via traces 270, 270A. The contact pads 272, 272A do not extend downwardly or as long as the conductive posts of the previous embodiment. Therefore, when electrically connecting contact pads 272 to contact pads 272A through vias 201A in dielectric element 262A, a relatively large mass of electrically conducted material, as for instance, solder 202 must be employed. The relative size of the mass of solder 202 must be large enough to allow the chips 212A, 232A to be positioned over a circuit panel 290, but below the left staggered stacked package 210. Of course, by positioning a right staggered stack package 210A beneath a left staggered stack package 210, the overall height H between a lower surface of the solder mass layer 282 of the left staggered stack package 210 to the first face 264A of dielectric element 262A of right staggered stack package 210A is somewhat lesser than that which would be required if non-altering staggered stack packages were not employed.

Once the staggered stack pack 200 has been constructed by the joining of the right staggered stack package 210A to left staggered stack package 210, the staggered stack pack 200 may be attached to a circuit panel or circuit board, such a circuit panel 290. To electrically connect the staggered stack package 200 to circuit panel 290, contact pads 272A are brought in proximity to and aligned with contacts 292 of circuit panel 290. Once the two elements are aligned, a mass of electrically conductive material, such as solder 294 may be disbursed in and around both of the contact pads 272A and contacts 292 to electrically connect the two. The height of the solder 294 must be of sufficient size so that curved portions 277A of wire leads 280A, which connect on contacts 218A, 238A to bond pads 268A, remain remote from the surface of the circuit panel 290.

Figure 8:
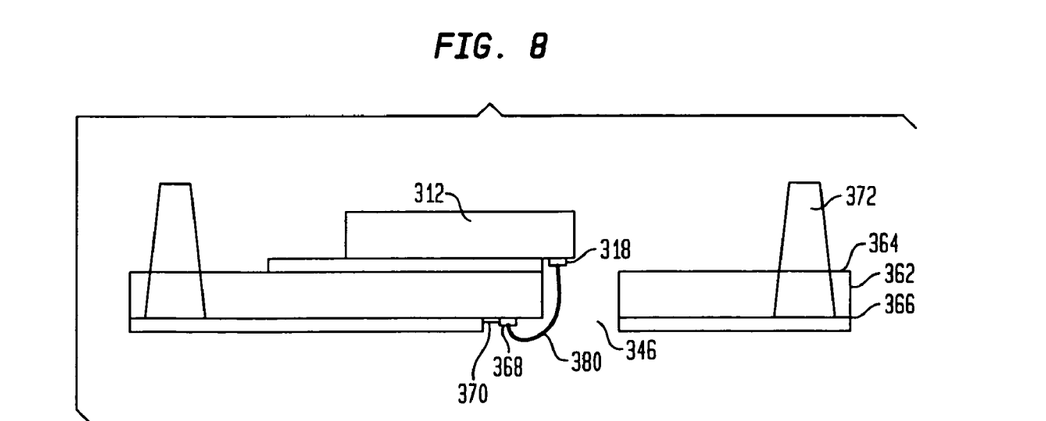
FIG. 8 is a cross-sectional view of an alternate embodiment of the present invention.

In an alternate embodiment, as shown in FIG. 8, the microelectronic package 310 may be constructed having a "pins in" configuration. Microelectronic package 310 includes a dielectric element 362 having a first surface 364 and an oppositely-facing second surface 366. As with prior embodiments, the dielectric element 360 includes bond pads 368, traces 370 and conductive posts 372. However, the conductive posts 372 face inwardly through the dielectric element 362 as opposed to outwardly.

Microelectronic package 310 is essentially similar to previous embodiments and includes chip 312 attached to the dielectric element 362. The chip 312 includes contacts 318, which are connected to the bond pads 368 using wire leads 380. And as before, the wire leads 380 extend through holes 346 in the dielectric element 360. Although only one chip is shown, microelectronic package 310, as well as other packages discussed herein may include one, two or even more chips.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
    a lower unit including a lower unit substrate having conductive features and a top and bottom surface, said lower unit including one or more lower unit chips overlying said top surface of said lower unit substrate that are electrically connected to said conductive features of said lower unit substrate, said one or more lower unit chips including top surfaces remote from said lower unit substrate and edge surfaces extending away from said top surfaces; and
    an upper unit including an upper unit substrate having conductive features, top and bottom surfaces and a hole extending between such top and bottom surfaces, said upper unit further including one or more upper unit chips overlying said top surface of said upper unit substrate and electrically connected to said conductive features of said upper unit substrate by connections extending within said hole, said upper unit substrate being disposed over said lower unit chips, said hole and said connections of said upper unit being offset in a first horizontal direction from said lower unit chips, said connections being offset in said first horizontal direction such that at least one edge surface of at least one of said lower unit chips is adjacent to said connections in said first horizontal direction.

2. The microelectronic package according to claim 1, further comprising electrically conductive connections electrically connecting said conductive features of said upper unit substrate and said lower unit substrate.

3. The microelectronic package according to claim 2, wherein said conductive connections define a pattern, said hole of said upper unit being offset in said first horizontal direction relative to said pattern, said one or more lower unit chips being offset relative to said pattern in a second horizontal direction opposite to said first horizontal direction.

4. The microelectronic package according to claim 3, wherein said lower unit has a hole extending between said top and bottom surfaces of said lower unit substrate, said one or more lower unit chips being electrically connected to conductive features of said lower unit substrate by connections extending through said hole in said lower unit substrate.

5. The microelectronic package according to claim 4, wherein said lower unit substrate is offset relative to said pattern of said conductive connections in said second horizontal direction.

6. The microelectronic package according to claim 1, wherein said one or more lower unit chips define a top surface and wherein said connections of said upper unit extend downwardly below said top surface of said one or more lower unit chips.

7. The microelectronic package according to claim 1, wherein said one or more lower unit chips define a top surface, said upper unit includes an upper unit encapsulant covering said connections of said upper unit and wherein said upper unit encapsulant extends downwardly below said top surface of said one or more lower unit chips.

8. The microelectronic package according to claim 1, wherein said lower unit includes one of a left staggered stack package and a right staggered stack package, wherein the upper unit includes the other of said left staggered stack package and said right staggered stack package.

9. The microelectronic package according to claim 1, wherein said connection elements are wire leads.

10. The microelectronic package according to claim 1, wherein said conductive features of said lower unit substrate include bond pads, traces and conductive posts.

11. A microelectronic package comprising:
    a first microelectronic element having a plurality of contacts;
    a second microelectronic element having a plurality of contacts, said first microelectronic element being positioned over said second microelectronic element;
    a dielectric element having a first face, a second face and a hole extending from said first face to said second face, said dielectric element further including conductive features exposed at said second face, said second microelectronic element being positioned above said dielectric element;

a first set of connection elements extending between said plurality of contacts of said first microelectronic element and at least some of said conductive features of said dielectric element;

a second set of connection elements extending between said plurality of contacts of said second microelectronic element and at least some of said conductive features of said dielectric element; and wherein at least some of said first set of connection elements and at least some of said second set of connection elements extend through said hole of said dielectric element.

12. The microelectronic package according to claim 11, wherein said first set of connection elements and said second set of connection elements include wire leads.

13. The microelectronic package according to claim 12, wherein said conductive features include bonds pads that are engaged directly to at least some of said first set of wire leads and at least some of said second set of wire leads.

14. The microelectronic package according to claim 13, wherein said conductive features include traces and conductive posts, at least some of said traces extending from at least some of said bonds pads to at least some of said conductive posts.

15. The microelectronic package according to claim 14, wherein said first set of wire leads and said second set of wire leads include portions extending below said bond pads of said dielectric element.

16. The microelectronic package according to claim 15, wherein said conductive posts have top surfaces adjacent said dielectric element and bottom surfaces remote from said dielectric element, said portions of said wire leads being positioned between said top surfaces and said bottom surfaces.

17. The microelectronic package according to claim 11, wherein said first microelectronic element includes a contact portion and a central portion adjacent said contact portion, wherein said second microelectronic element includes a contact portion and a central portion, wherein said central portion of said first microelectronic element overlies said contact portion of said second microelectronic element such that said contact portion of said first microelectronic element extends outwardly beyond said contact portion of said second microelectronic element.

18. The microelectronic package according to claim 11, further comprising a circuit panel having contacts, wherein at least some of said conductive features of said dielectric element are electrically connected to said contacts of said circuit panel.

19. The microelectronic package of claim 1, wherein said connections extend a first distance in a vertical direction downward from a lower surface of said upper unit substrate and an upper surface of said at least one lower unit chip is disposed a second distance from said lower surface of said upper unit substrate, said second distance being less than said first distance.

* * * * *

UNITED STATES PATENT AND TRADEMARK OFFICE
CERTIFICATE OF CORRECTION

| | | |
|---|---|---|
| PATENT NO. | : 7,638,868 B2 | Page 1 of 1 |
| APPLICATION NO. | : 11/504857 | |
| DATED | : December 29, 2009 | |
| INVENTOR(S) | : Belgacem Haba | |

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 451 days.

Signed and Sealed this

Seventh Day of September, 2010

David J. Kappos
*Director of the United States Patent and Trademark Office*